(12) United States Patent
Nale

(10) Patent No.: US 10,884,941 B2
(45) Date of Patent: Jan. 5, 2021

(54) TECHNIQUES TO STORE DATA FOR CRITICAL CHUNK OPERATIONS

(71) Applicant: INTEL CORPORATION, Santa Clara, CA (US)

(72) Inventor: Bill Nale, Livermore, CA (US)

(73) Assignee: INTEL CORPORATION, Santa Clara, CA (US)

(*) Notice: Subject to any disclaimer, the term of this patent is extended or adjusted under 35 U.S.C. 154(b) by 525 days.

(21) Appl. No.: 15/720,027

(22) Filed: Sep. 29, 2017

(65) Prior Publication Data

US 2019/0102313 A1 Apr. 4, 2019

(51) Int. Cl.
| | |
|---|---|
| *G11C 11/406* | (2006.01) |
| *G11C 11/4076* | (2006.01) |
| *G06F 13/16* | (2006.01) |
| *G11C 11/4074* | (2006.01) |
| *G06F 12/0895* | (2016.01) |
| *G06F 3/06* | (2006.01) |
| *G06F 11/10* | (2006.01) |
| *G11C 29/52* | (2006.01) |
| *G06F 12/0811* | (2016.01) |
| *G11C 29/00* | (2006.01) |
| *G11C 29/44* | (2006.01) |

(52) U.S. Cl.
CPC .......... *G06F 12/0895* (2013.01); *G06F 3/065* (2013.01); *G06F 3/067* (2013.01); *G06F 3/0611* (2013.01); *G06F 3/0619* (2013.01); *G06F 11/1064* (2013.01); *G06F 11/1068* (2013.01); *G06F 12/0811* (2013.01); *G11C 29/52* (2013.01); *G11C 29/824* (2013.01); *G06F 2212/283* (2013.01); *G06F 2212/608* (2013.01); *G11C 29/74* (2013.01); *G11C 2029/4402* (2013.01)

(58) Field of Classification Search
None
See application file for complete search history.

(56) References Cited

U.S. PATENT DOCUMENTS

| | | | | | |
|---|---|---|---|---|---|
| 5,809,524 | A | * | 9/1998 | Singh | .................... G06F 12/123 711/118 |
| 5,832,534 | A | * | 11/1998 | Singh | .................. G06F 12/0811 711/141 |
| 2003/0018855 | A1 | * | 1/2003 | McWilliams | ......... G06F 12/126 711/128 |
| 2004/0024952 | A1 | * | 2/2004 | Bains | .................. G06F 12/0864 711/5 |
| 2004/0024958 | A1 | * | 2/2004 | Bains | .................. G06F 12/0864 711/105 |
| 2004/0030845 | A1 | * | 2/2004 | DeLano | ................ G06F 12/084 711/150 |
| 2004/0181626 | A1 | * | 9/2004 | Pickett | ................ G06F 12/0864 711/3 |

(Continued)

*Primary Examiner* — Jared I Rutz
*Assistant Examiner* — Marwan Ayash
(74) *Attorney, Agent, or Firm* — Kacvinsky Daisak Bluni PLLC

(57) ABSTRACT

Various embodiments are generally directed to techniques to store data for critical chunk operations, such as by utilizing a spare lane, for instance. Some embodiments are particularly directed to a memory controller that stores a portion of a critical chunk in a spare lane to enable the entire critical chunk to be stored in a half of the cache line.

25 Claims, 14 Drawing Sheets

600

Implement a spare lane in a Memory, the Memory to include a cache line comprising first and second portions of a critical chunk, the first portion included in a first half of the cache line and the second portion included in a second half of the cache line
602

↓

Identify a set of bits in the spare lane that correspond to the cache line, the set of bits to comprise a first subset of bits that correspond to the first half of the cache line and a second subset of bits that correspond to the second half of the cache line
604

↓

Store a copy of the first portion of the cache line to the second subset of bits in the spare lane.
606

(56) References Cited

U.S. PATENT DOCUMENTS

| | | | |
|---|---|---|---|
| 2005/0172091 A1* | 8/2005 | Rotithor | G06F 13/161 711/157 |
| 2005/0289439 A1* | 12/2005 | Nerl | G06F 11/1012 714/763 |
| 2007/0300032 A1* | 12/2007 | Berry | G06F 12/0855 711/167 |
| 2008/0082878 A1* | 4/2008 | Check | G01R 31/31717 714/724 |
| 2008/0266999 A1* | 10/2008 | Thayer | G11C 8/20 365/230.03 |
| 2008/0270675 A1* | 10/2008 | Nagaraj | G06F 12/0246 711/100 |
| 2013/0304993 A1* | 11/2013 | DeBruyne | G06F 12/0875 711/125 |
| 2014/0115382 A1* | 4/2014 | Sainath | G06F 11/073 714/6.11 |
| 2014/0229797 A1* | 8/2014 | Agrawal | G06F 11/1064 714/766 |
| 2015/0095579 A1* | 4/2015 | Samih | G06F 12/0859 711/129 |
| 2016/0291894 A1* | 10/2016 | Yeung | G06F 13/4068 |
| 2017/0255531 A1* | 9/2017 | Gostin | G11C 29/74 |

\* cited by examiner

Memory 102

Cache line 302

| First half 308 | Second half 310 |
|---|---|
| Primary lanes bit subset 304-1 | Primary lanes bit subset 304-2 |
| Portion 406-1 | Portion 406-1 |
| Data 410-1 | Data 410-2 |
| Spare lane bit subset 306-1 | Spare lane bit subset 306-2 |
| Portion 406-2 | Portion 406-2 |

Implement a spare lane in a Memory, the Memory to include a cache line comprising first and second portions of a critical chunk, the first portion included in a first half of the cache line and the second portion included in a second half of the cache line
602

Identify a set of bits in the spare lane that correspond to the cache line, the set of bits to comprise a first subset of bits that correspond to the first half of the cache line and a second subset of bits that correspond to the second half of the cache line
604

Store a copy of the first portion of the cache line to the second subset of bits in the spare lane.
606

*FIG. 7*

Storage Medium 700

*Computer Executable Instructions for 600*

TECHNIQUES TO STORE DATA FOR CRITICAL CHUNK OPERATIONS

BACKGROUND

A critical chunk may refer to one or more portions of a cache line that include immediate data requested by an application. Typically, a critical chunk includes data that is required first by an application to carry out an operation. Critical chunks are commonly used in a dynamic random access memory (DRAM) system when reading a cache line from memory. For instance, a cache line may be 64 bytes, however a critical chunk may only include data stored in one half of the cache line. In such instances, a critical chunk operation may allow the half of the cache line that includes the critical chunk to be sent first.

BRIEF DESCRIPTION OF THE DRAWINGS

FIG. 5A, FIG. 5B, and FIG. 5C illustrate one or more embodiments of exemplary utilization of a spare lane.

FIG. 6 illustrates an embodiment of a logic flow.

FIG. 7 illustrates an embodiment of a storage medium.

DETAILED DESCRIPTION

Figure 1:
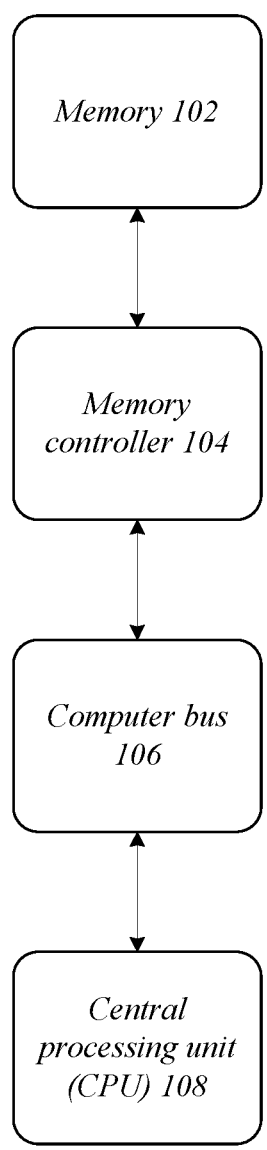
FIG. 1 illustrates an exemplary system according to one or more embodiments described herein.

Various embodiments are generally directed to techniques to store data for critical chunk operations, such as by utilizing a spare lane, for instance. Some embodiments are particularly directed to a memory controller that stores a portion of a critical chunk in a spare lane to enable the entire critical chunk to be stored in a half of the cache line. In one embodiment, for example, an apparatus for memory management may comprise a memory and a memory controller comprising logic, at least a portion of the logic implemented in circuitry coupled to the memory. In various embodiments, the logic may implement a spare lane in a memory that includes a cache line comprising first and second portions of a critical chunk, the first portion included in a first half of the cache line and the second portion included in a second half of the cache line. In various such embodiments, the logic may identify a set of bits in the spare lane that correspond to the cache line, the set of bits including a first subset of bits that correspond to the first half of the cache line and a second subset of bits that correspond to the second half of the cache line. In further embodiments, the logic may store a copy of the first portion of the cache line to the second subset of bits in the spare lane. These and other embodiments are described and claimed.

Some challenges facing memory controllers include the inability provide an entire critical chunk to a central processing unit (CPU) without providing both halves of a cache line. These challenges may result from a critical chunk being sufficiently large as to require bits in both halve of a cache line. For instances, in a two level memory (2LM) system, where DRAM is being used as a cache for slower memory (e.g., behind a double data rate transactional (DDR-T) dual in-line memory module (DIMM)), a cache tag may be stored in the DRAM. However, the cache tag may be too large to fit in one half of a cache line. In such instances, this may prevent critical chunk operations from being utilized. In another instance, the DDR-T/DDR-T2 protocols may require both halves of a cache line to carry a Read ID, such as in 2LM systems, again preventing critical chunk operations from being utilized. These and other factors may result in a memory controller with poor efficiency and limited functionality. Such limitations can reduce memory performance in a system utilizing the memory controller, such as a personal computer, contributing to ineffective systems with inefficient memory performance and limited capabilities.

Various embodiments described herein include a memory controller that can store a copy of a portion of a critical chunk in a spare lane such that the entire critical chunk can be provided to a CPU using one half of a cache line. In some embodiments, the memory controller may utilize the spare lane to store an entire critical chunk in each half of a cache line. For example, the critical chunk may include metadata (e.g., a cache tag or a Read ID) stored in both halves of a cache line. In such examples, the metadata that is normally in the first half of the cache line may be copied or mapped to spare lane bits associated with the second half of the cache line and metadata that is normally in the second half of the cache line may be copied or mapped to spare lane bits associated with the first half of the cache line. In embodiments, the memory controller may allow critical chunk operations to be used in 2LM and/or DDR-T2 environments when a spare lane is implemented by the memory controller and the DDR-T interface. In one or more embodiments, the memory controller may store the critical chunk in the same locations in the two halves of the cache line such that the memory controller does not have to multiplex (MUX) the data depending on which half comes first. In various embodiments, the memory controller may arrange the bits in a critical chunk separately, such as depending on which half of a cache line is requested. In these and other ways the memory controller may enable reliable and efficient critical chunk operation to achieve improved memory performance, such as by reducing the overall number of memory operations required to provide a critical chunk to a CPU, resulting in several technical effects and advantages.

With general reference to notations and nomenclature used herein, one or more portions of the detailed description which follows may be presented in terms of program procedures executed on a computer or network of computers. These procedural descriptions and representations are used by those skilled in the art to most effectively convey the substances of their work to others skilled in the art. A procedure is here, and generally, conceived to be a self-consistent sequence of operations leading to a desired result. These operations are those requiring physical manipulations of physical quantities. Usually, though not necessarily, these quantities take the form of electrical, magnetic, or optical signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to those quantities.

Further, these manipulations are often referred to in terms, such as adding or comparing, which are commonly associated with mental operations performed by a human operator. However, no such capability of a human operator is necessary, or desirable in most cases, in any of the operations described herein that form part of one or more embodiments. Rather, these operations are machine operations. Useful machines for performing operations of various embodiments include general purpose digital computers as selectively activated or configured by a computer program stored within that is written in accordance with the teachings herein, and/or include apparatus specially constructed for the required purpose. Various embodiments also relate to apparatus or systems for performing these operations. These apparatuses may be specially constructed for the required purpose or may include a general-purpose computer. The required structure for a variety of these machines will be apparent from the description given.

Reference is now made to the drawings, wherein like reference numerals are used to refer to like elements throughout. In the following description, for purpose of explanation, numerous specific details are set forth in order to provide a thorough understanding thereof. It may be evident, however, that the novel embodiments can be practiced without these specific details. In other instances, well known structures and devices are shown in block diagram form to facilitate a description thereof. The intention is to cover all modification, equivalents, and alternatives within the scope of the claims.

FIG. 1 illustrates an exemplary system 100 that may be representative of various embodiments described herein. System 100 may include memory 102, memory controller 104, computer bus 106, and central processing unit (CPU) 108. In operating environment 100, memory controller 104 may support memory operations between memory 102 and CPU 108 via computer bus 106. In one or more embodiments, memory controller 104 may implement a spare lane in memory 102. In one or more such embodiments, memory controller 104 may utilize the spare lane to perform critical chunk operations. The embodiments are not limited in this context.

In various embodiments, memory controller 104 may provide data from memory 102 to CPU 108 via computer bus 106. In various such embodiments, the data provided from memory 102 may be based on a request received from CPU 108 by memory controller 104. In one or more embodiments, computer bus 106 may include a DDR-T2 interface. In some embodiments, computer bus 106 may include a set pins. In some such embodiments, each pin in computer bus 106 may be capable of simultaneously relaying one bit between memory controller 104 and CPU 108. For example, if computer bus 106 has 32 pins, 32 bits of data may be simultaneously relayed between memory controller 104 and CPU 108. In various embodiments, the set of pins may include a plurality of primary pins and at least one spare pin. In various such embodiments, each primary pin of the plurality of primary pins may correspond to a primary lane and each spare pin of the at least one spare pin may correspond to a spare lane.

In one or more embodiments, memory controller 104 may implement the primary and spare lanes in memory 102 (see e.g., FIGS. 2A-3B). In one or more such embodiments, this may enable memory controller 104 to move data in memory 102 corresponding to a primary lane to be moved to a spare lane in response to a determination that one of the primary lanes is faulty (e.g., failure of a corresponding primary pin). In some embodiments, moving data from a faulty lane to the spare lane may prevent error correcting code (ECC) errors by masking out the faulty lane. However, in various embodiments described herein, memory controller 104 may utilize a spare lane to enable an entire critical chunk to be stored in one half of a cache line in memory 102 when the spare lane is not otherwise utilized, such as in response to a faulty primary lane (see e.g., FIGS. 4A-5C). In various such embodiments, storing the entire critical chunk in one half of the cache line may enable the entire critical chunk to be simultaneously communicated from memory controller 104 to CPU 108 via memory bus 106, resulting in improved memory performance. In one or more embodiments described herein, a cache line may refer to a chunk of memory of a size that is stored in a cache of CPU 108.

Figure 2A:
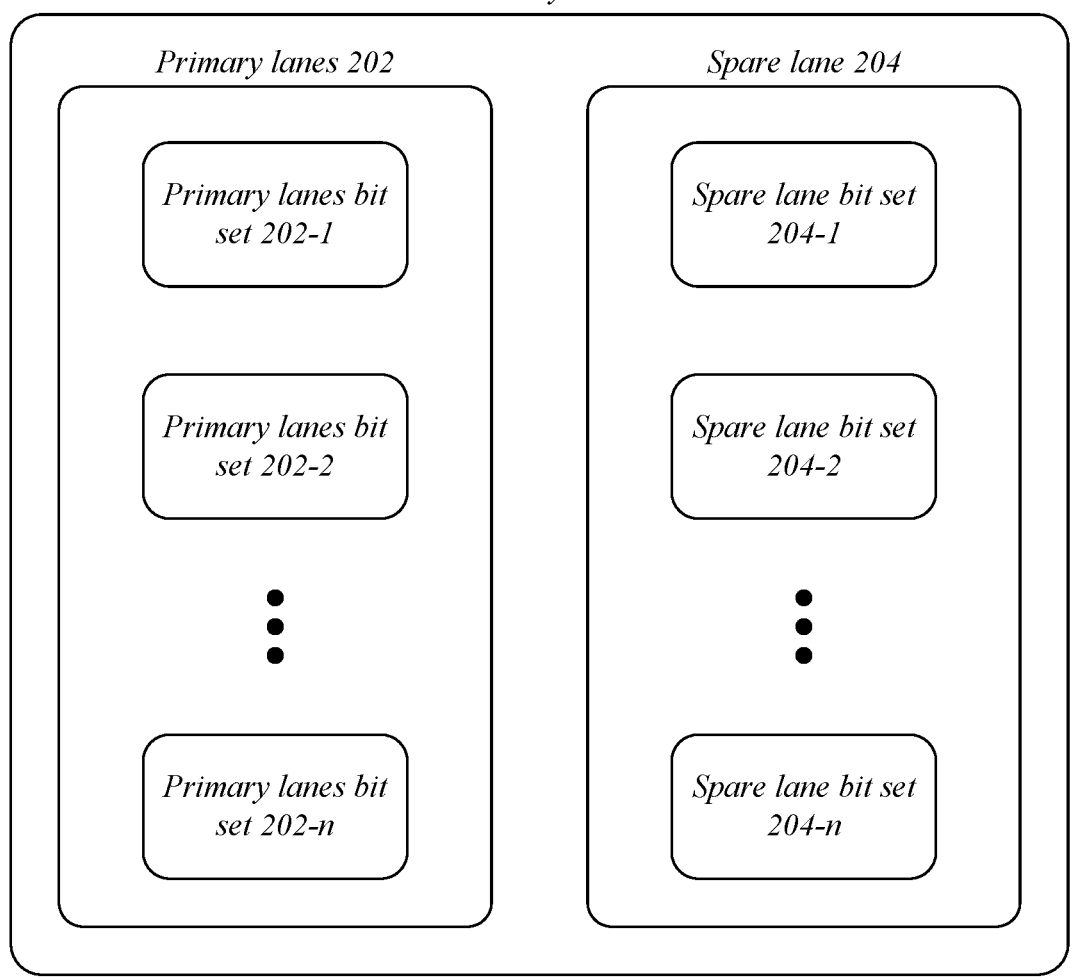
FIG. 2A and FIG. 2B illustrate one or more embodiments of an exemplary memory.
Figure 2B:
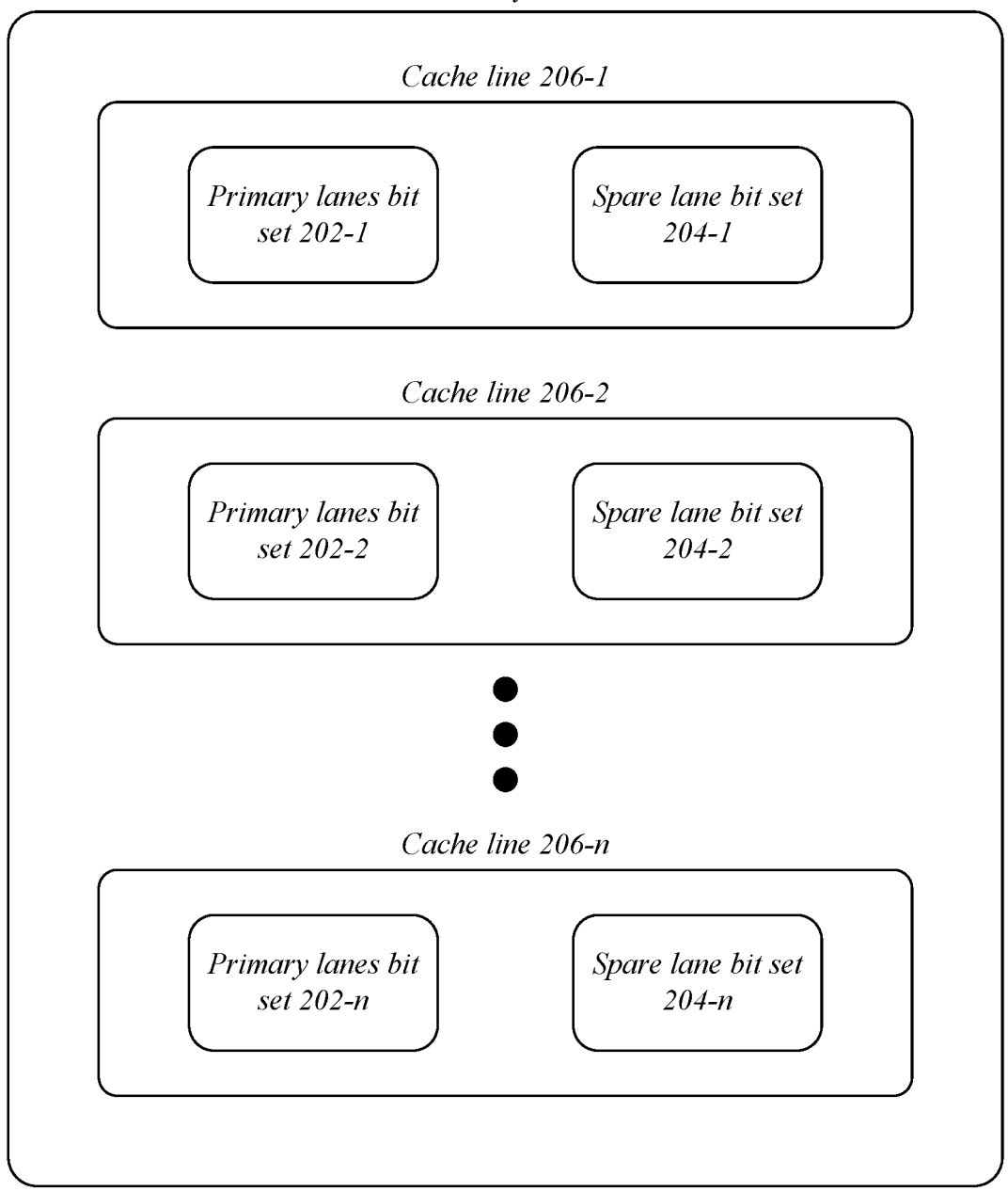

FIG. 2A and FIG. 2B illustrate embodiments 200A, 200B of memory 102. As shown in FIG. 2A, memory 102 may include primary lanes 202 and spare lane 204. In embodiment 200A, primary lanes 202 may include one or more primary lanes bit sets 202-1, 202-2, 202-$n$ and spare lane 204 may include one or more spare lane bit sets 204-1, 204-2, 204-$n$. In various embodiments, memory controller 104 may implement one or more of primary lanes 202 and spare lane 204 in memory 102. As shown in FIG. 2B, memory 102 may include one or more cache lines 206-1, 206-2, 206-$n$. In embodiment 200B, cache line 206-1 may include primary lanes bit set 202-1 and spare lane bit set 204-1, cache line 206-2 may include primary lanes bit set 202-2 and spare lane bit set 204-2, and cache line 206-$n$ may include primary lanes bit set 202-$n$ and spare lane bit set 204-$n$. Thus, according to one or more embodiments described herein, each of the one or more cache lines 206-1, 206-2, 206-$n$ in memory 102 may correspond to a respective set of bits in primary lanes 202 and a respective set of bits in spare lane 204. In one or more such embodiments, implementation of one or more of primary lanes 202 and spare lane 204 by memory controller 104 may result in one or more of these correspondences. Embodiments are not limited in this context.

Figure 3A:
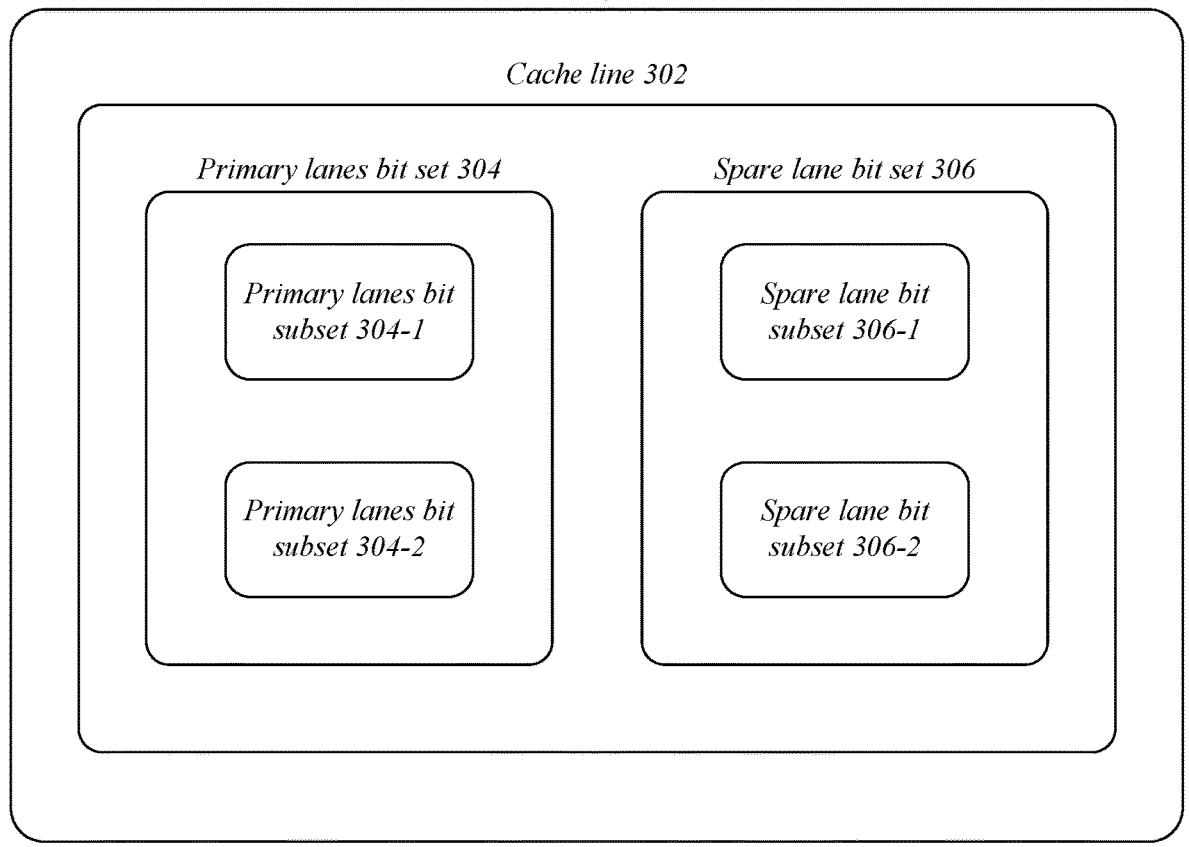
FIG. 3A and FIG. 3B illustrate one or more embodiments of exemplary cache lines in a memory.
Figure 3B:
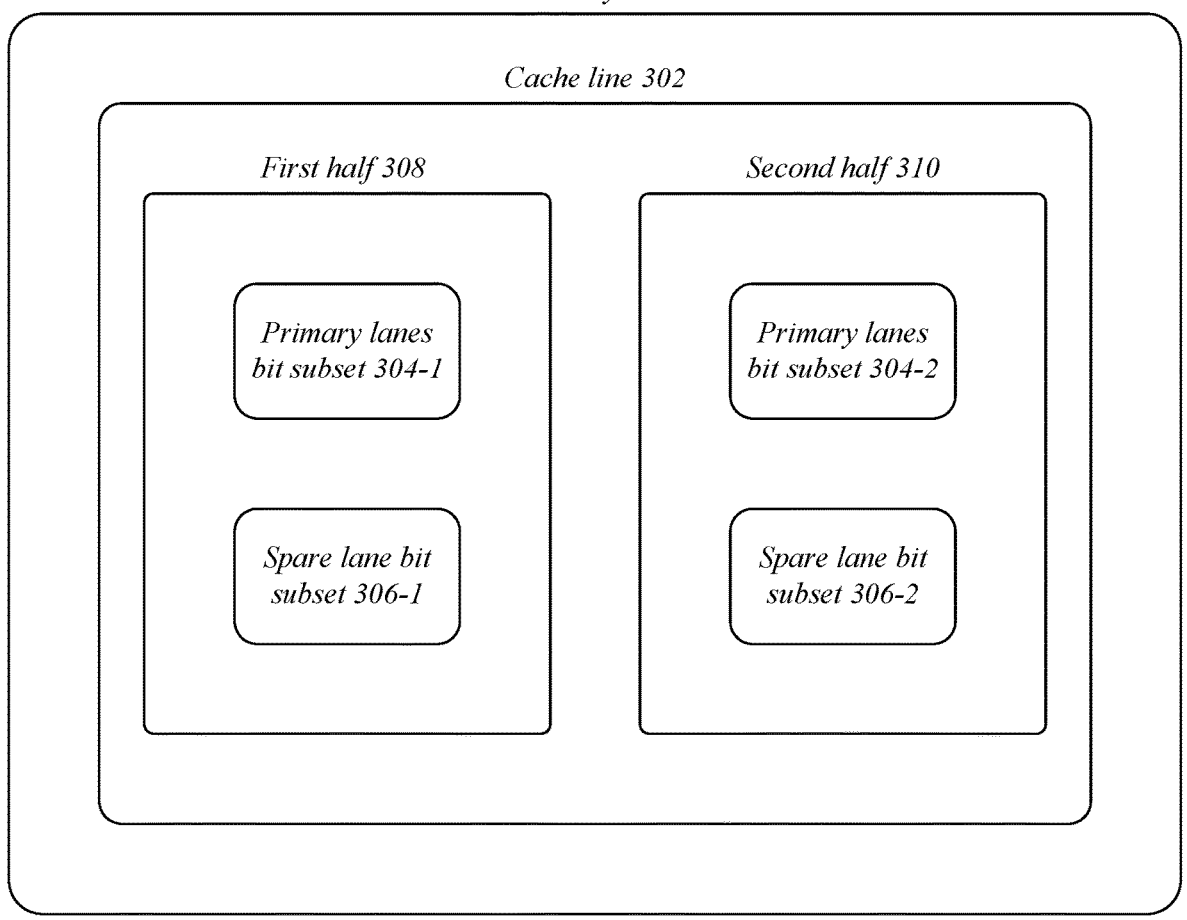

FIG. 3A and FIG. 3B illustrate embodiments 300A, 300B of a cache line 302 in memory 102. In various embodiments, cache line 302 may be the same or similar to one or more of cache lines 206-1, 206-2, 206-$n$. As shown in FIG. 3A, cache line 302 may include primary lanes bit set 304 and spare lane bit set 306. In some embodiments, primary lanes bit set 304 may be the same or similar to one or more of primary lanes bit sets 202-1, 202-2, 202-$n$ and spare lane bit set 306 may be the same or similar to one or more of spare lane bit sets 204-1, 204-2, 204-$n$. In embodiment 300A, primary lanes bit set 304 may include primary lanes bit subset 304-1, 304-2 and spare lane bit set 306 may include spare lane bit subset 306-1, 306-2. As shown in FIG. 3B, cache line 302 may include a first half 308 and a second half 310. In various embodiments, each half of cache line 302 may be independently accessed. In embodiment 300B, the first half 308 of cache line 302 may include primary lanes bit subset 304-1 and spare lane bit subset 306-1 and the second half 310 of cache line 302 may include primary lanes bit subset 304-2 and spare lane bit subset 306-2. Embodiments are not limited in this context.

Figure 4A:
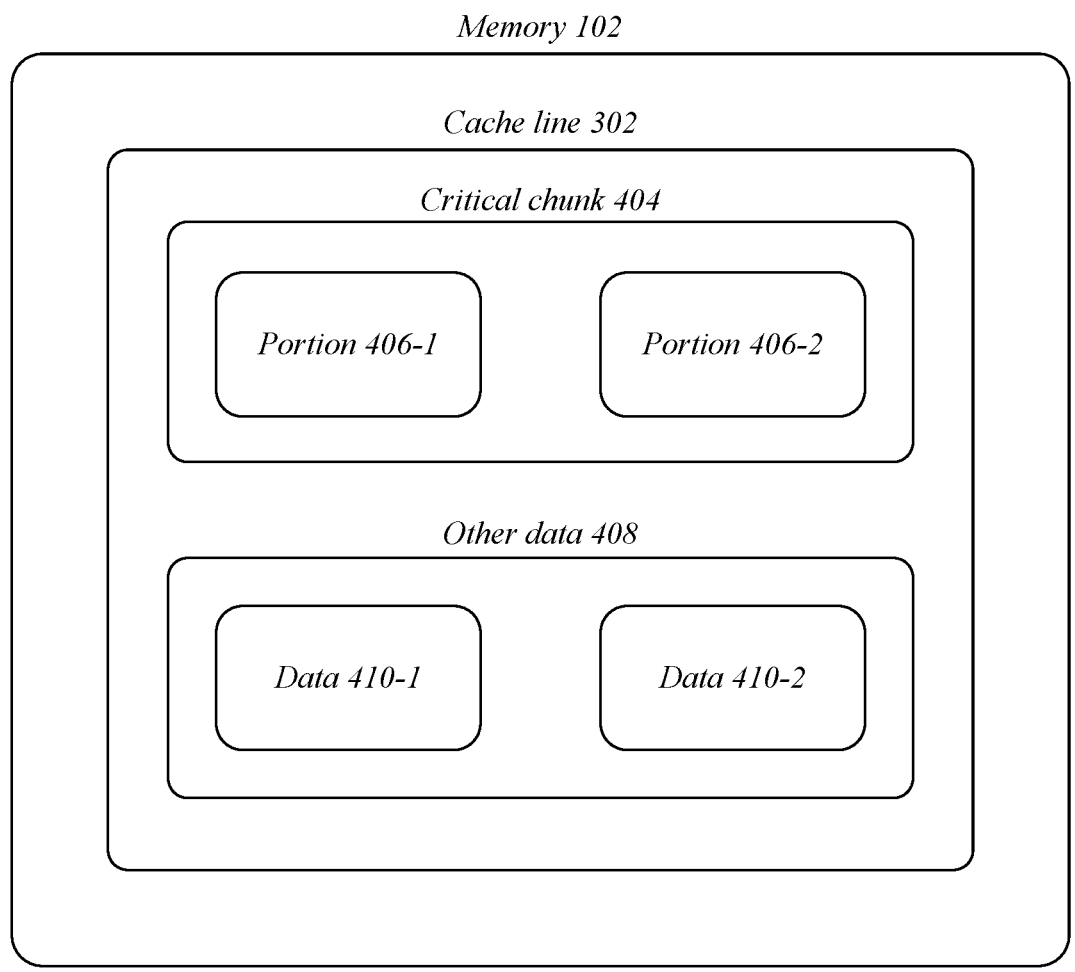
FIG. 4A and FIG. 4B illustrate one or more embodiments of exemplary contents of a cache line.
Figure 4B:
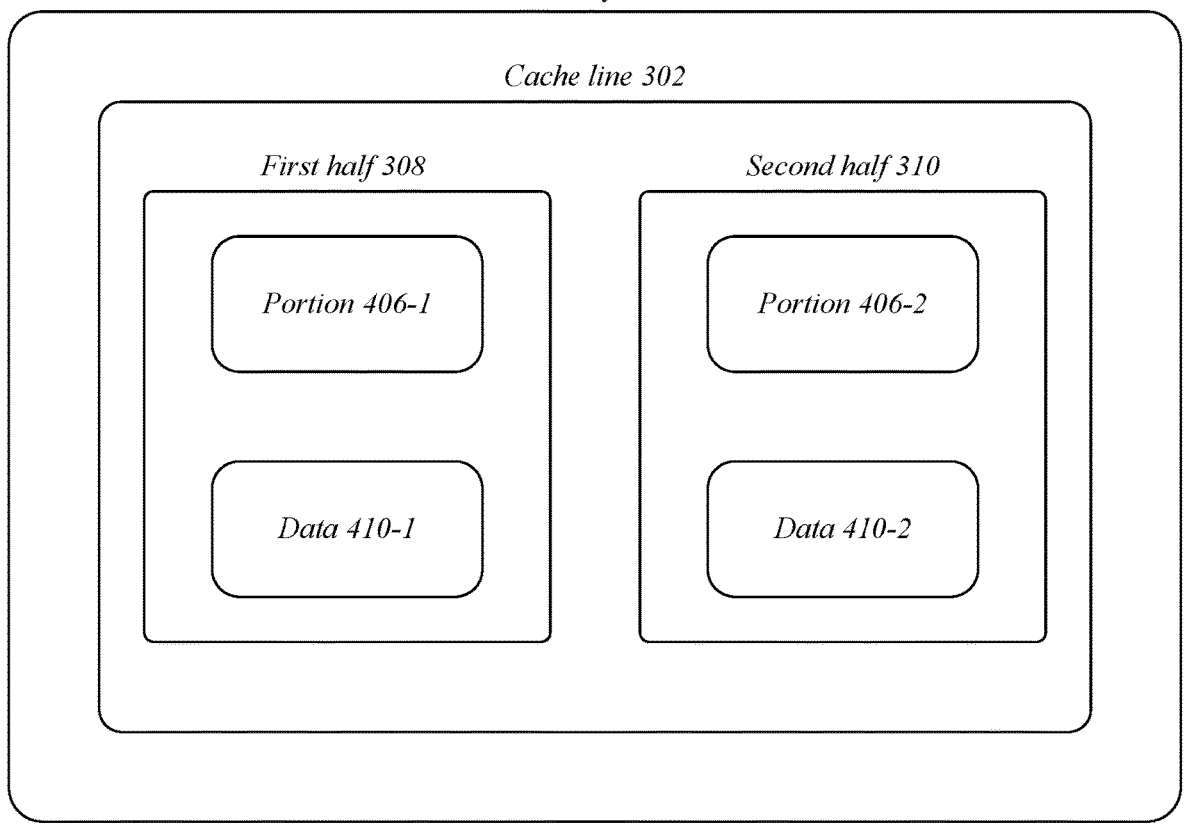

FIG. 4A and FIG. 4B illustrate embodiments 400A, 400B of exemplary contents of cache line 302 in memory 102. As shown in FIG. 4A, the contents of cache line 302 may include critical chunk 404 and other data 408. In embodiment 400A, critical chunk 404 may include portions 406-1, 406-2 and other data 408 may include data 410-1, 410-2. As show in FIG. 4B, the contents of the first half 308 of cache line 302 may include portion 406-1 of critical chunk 404 and data 410-1 of other data 408 while the contents of the second half 310 of cache line 302 may include portion 406-2 of critical chunk 404 and data 410-2 of other data 408. Embodiments are not limited in this context.

In one or more embodiments, critical chunk 404 may include data relayed in a critical chunk operations. As previously described, critical chunk operations may enable improve memory performance. In various embodiments, critical chunk 404 may include metadata. In various such embodiments, the metadata may be redundant. In some embodiments, critical chunk 404 may only include part of the metadata stored in cache line 302. In some such embodiments, the critical chunk part of the metadata may be stored in one half of the cache line while the non-critical chunk part of the metadata may be stored in the other half of the cache line. For instance, a critical chunk may include a read ID, and the DDR-T protocol requires an amount of metadata to carry the read ID and other information so as to require bits in both halves of cache line 302. In DDR5, due to additional bits required for error correcting code (ECC), enough spare bits may be available to allow a spare lane to be utilized.

In many embodiments, the spare lane may be used when by ECC when the memory controller 104 determines that one of the computer bus lanes are faulty. In many such embodiments, data from the faulty lane will be moved to the spare lane to prevent ECC errors by masking out the faulty lane. Thus, critical chunk 404 may not be stored in the spare lane based on a determination by memory controller 104, such as when computer bus 106 has a faulty lane.

Figure 5A:
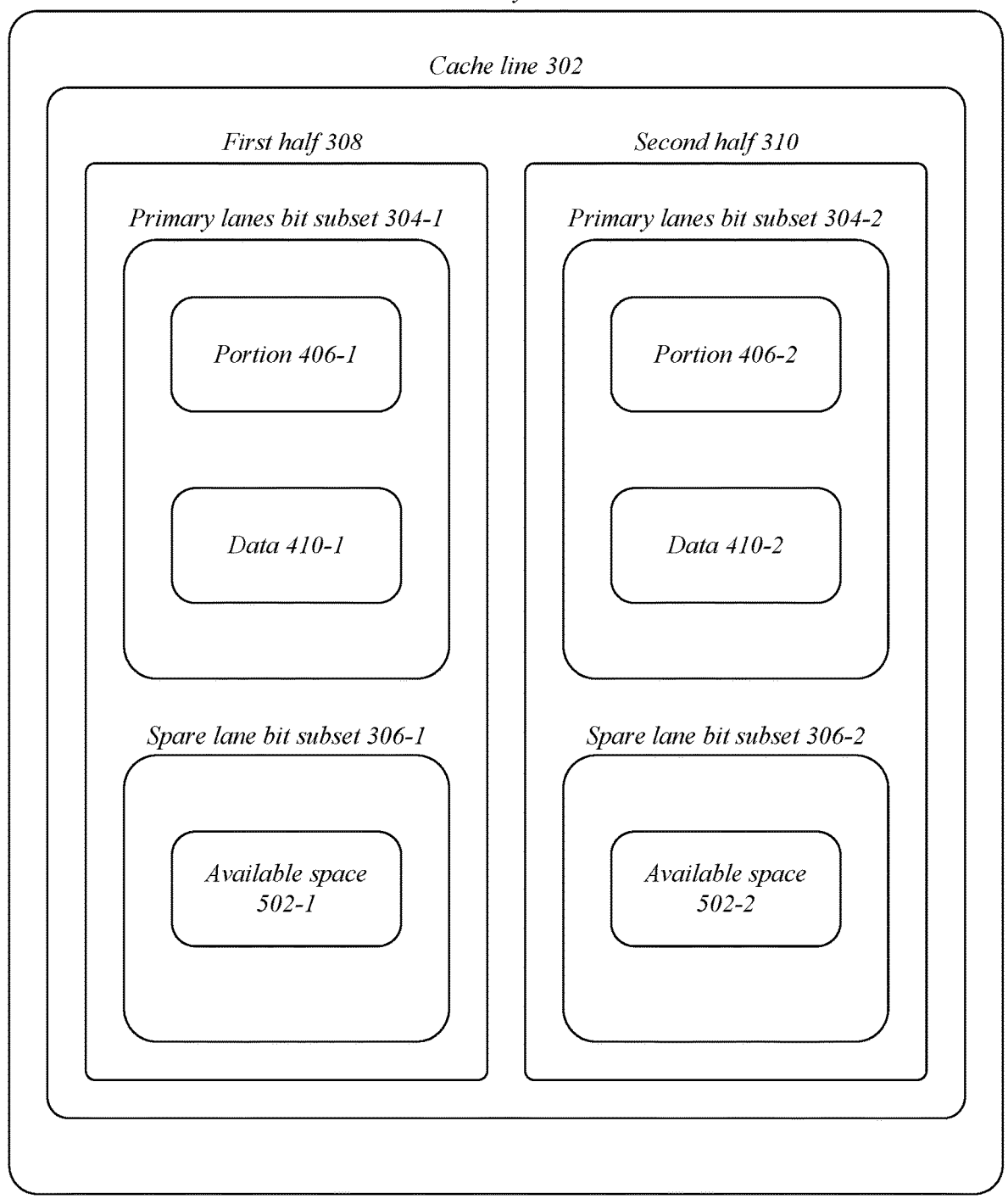
Figure 5B:
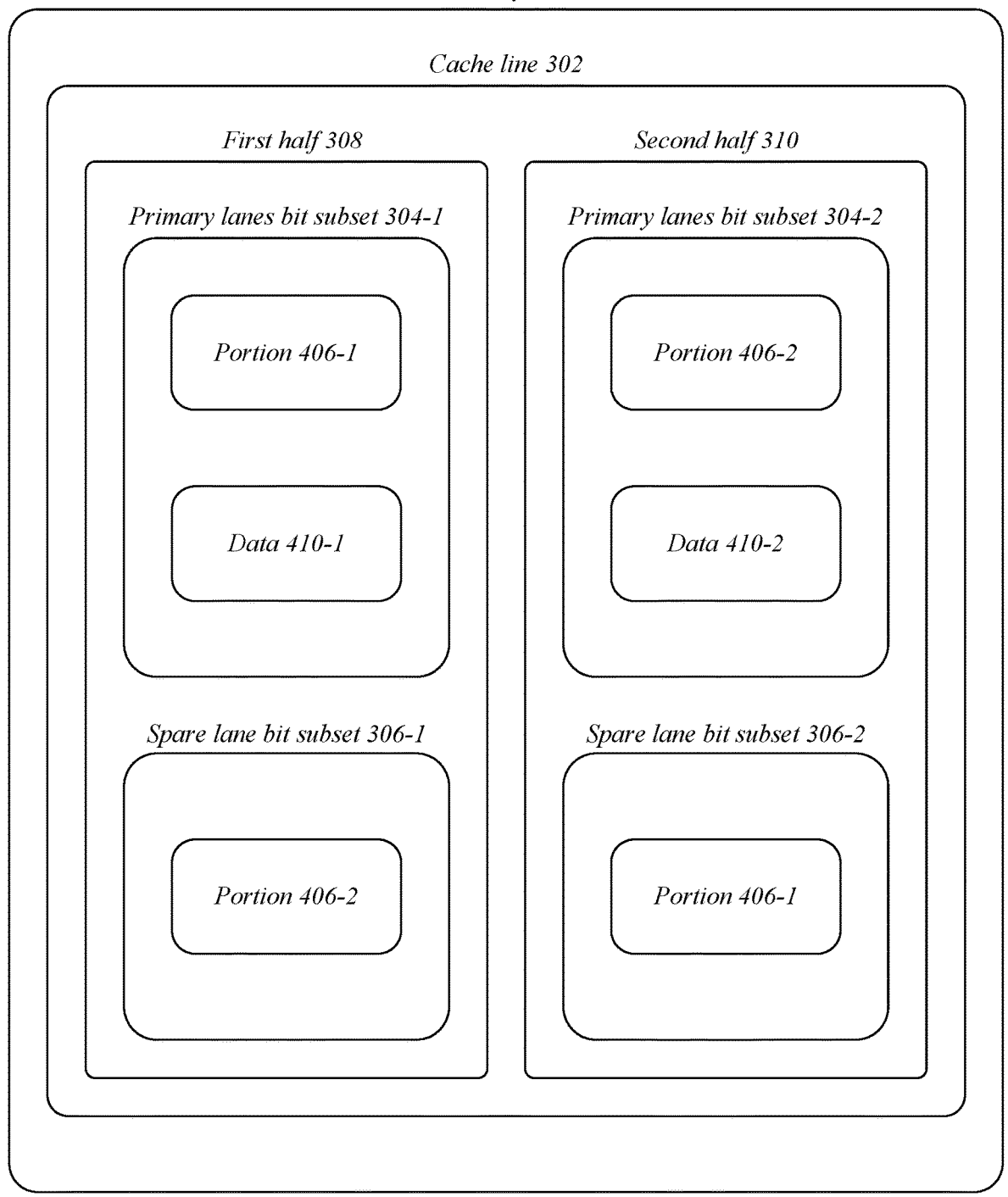

FIG. 5A, FIG. 5B, and FIG. 5C illustrate embodiments 500A, 500B, 500C of exemplary utilization of a spare lane (e.g., spare lane 204) to store one or more portions (e.g., portions 406-1, 406-2) of a critical chunk (e.g., critical chunk 404). In various embodiments, available space (e.g., available space 502-1, 502-2) may be used to store copies of portions (e.g., portions 406-1, 406-2) of a critical chunk (e.g., critical chunk 404) such that the entire critical chunk may be stored in both the first and second halves 308, 310 of cache line 302. Embodiments are not limited in this context.

Referring specifically to FIG. 5A, the first half 308 of cache line 302 in memory 102 may include portion 406-1 of critical chunk 404 and data 410-1 of other data 408 within primary lanes bit subset 304-1 and available space 502-1 within spare lane bit subset 306-1. Further, the second half 310 of cache line 302 in memory 102 may include portion 406-2 of critical chunk 404 and data 410-2 of other data 408 within primary lanes bit subset 304-2 and available space 502-2 within spare lane bit subset 306-2.

Referring specifically to FIG. 5B, in response to determining spare lane bit subset 304-1 includes available space 502-1, memory controller 104 may store a copy of portion 406-2 of critical chunk 404 to replace available space 502-1 in spare lane bit subset 304-1 such that the first half 308 of cache line 302 includes both portions 406-1, 406-2 of critical chunk 404. In some embodiments, in response to determining spare lane bit subset 304-2 includes available space 502-2, memory controller 104 may store a copy of portion 406-1 of critical chunk 404 to replace available space 502-2 in spare lane bit subset 304-2 such that the second half 310 of cache line 302 includes both portions 406-1, 406-2 of critical chunk 404. In one or more embodiments described herein, this may enable CPU 108 to execute an operation that requires the entire critical chunk 404 without memory controller 104 being required to provide both halves 308, 310 of cache line 302 to CPU 108 via computer bus 106.

Referring specifically to FIG. 5C, in response to determining spare lane bit subset 304-1 includes available space 502-1, memory controller 104 may store a copy of portion 406-2 of critical chunk 404 to replace available space 502-1 in spare lane bit subset 304-1 such that the first half 308 of cache line 302 includes both portions 406-1, 406-2 of critical chunk 404. In some embodiments, in response to determining spare lane bit subset 304-2 includes available space 502-2, memory controller 104 may store a copy of portion 406-2 of critical chunk 404 to replace available space 502-2 in spare lane bit subset 304-2 and store a copy of portion 406-1 of critical chunk 404 to replace portion 406-1 in primary lanes bit subset 304-2 such that the second half 310 of cache line 302 includes both portions 406-1, 406-2 of critical chunk 404. In contrast with embodiment 500B, embodiment 500C includes both portions 406-1, 406-2 of critical chunk 404 in the same order in both halves 308, 310 of cache line 302. Thus, embodiment 500C may enable memory controller 104 to provide a single half of cache line 302 to CPU 108 via computer bus 106 without having to MUX the contents based on which half is provided first.

For some protocols, such as DDR-T2, an additional enhancement may be performed. For example, for DRAMs, strict redundancy of metadata is required for critical chunk operations. As the DRAM is just sending back the data that was previously written (requesting the $2^{nd}$ half of the cache line may switch the order of metadata). For a DDR-T2 or similarly capable memory controller, the memory controller may be supplying the metadata bits, and could arrange these bits separately depending on which half of the cache line is requested. In some embodiments, this may allow for additional metadata bits to be sent across computer bus 106 when the spare lane is available. In one or more embodiments, the metadata bits which must be sent first (i.e., the critical chunk 404) will be put in the half of the cache line which is transferred first, and metadata bits which are not immediately needed (i.e., a portion of other data 408) are sent during the second half of the transfer. In many embodiments, these extra metadata bits may not be transferred when the spare lane is being used. Thus, applications which absolutely require the extra metadata bits may not support the spare lane feature. In some embodiments, a tradeoff between ECC effectiveness and amount of spare lane space available may be made. For example, ECC effectiveness may be lowered to gain more bits available in a spare lane for a critical chunk operation.

FIG. 6 illustrates one embodiment of a logic flow 600, which may be representative of operations that may be executed in various embodiments in conjunction with utilizing a spare lane for critical chunk operations. The logic flow 600 may be representative of some or all of the operations that may be executed by or implemented via one or more components illustrated in FIGS. 1-5C, such as memory controller 104 of FIG. 1. The embodiments are not limited in this context.

In the illustrated embodiment shown in FIG. 6, the logic flow 600 may begin at block 602. At block 602 "implement a spare lane in a memory, the memory to include a cache line comprising first and second portions of a critical chunk, the first portion included in a first half of the cache line and the second portion included in a second half of the cache line" a spare lane may be implemented in a memory that includes a cache line comprising first and second portions of a critical chunk with the first portion included in a first half of the cache line and the second portion included in the second half of the cache line. For instance, memory controller 104 may implement spare lane 204 in memory 102. In such instances, the memory 102 may include cache line 302 with portion 406-1 of critical chunk 404 stored in first half 308 and portion 406-2 of critical chunk 404 stored in second half 310.

Continuing to block 604 "identify a set of bits in the spare lane that correspond to the cache line, the set of bits to comprise a first subset of bits that correspond to the first half of the cache line and a second subset of bits that correspond to the second half of the cache line" a set of bits in the spare lane that correspond to the cache line may be identified, the set of bits may include a first subset of bits that correspond to the first half of the cache line and a second subset of bits that correspond to the second half of the cache line. For example, memory controller 104 may identify that spare lane bit set 306 corresponds to cache line 302. In such examples, spare lane bit set 306 may include spare lane bit subset 306-1 that corresponds to the first half 308 of cache line 302 and spare lane bit subset 306-2 that corresponds to the second half 310 of cache line 302.

Proceeding to block 606 "store a copy of the first portion of the cache line to the second subset of bits in the spare lane" a copy of the first portion of the cache line may be stored to the second subset of bits in the spare lane. For instance, memory controller 104 may store a copy of portion 406-1 of critical chunk 404 to spare lane bit subset 306-2. In some embodiments, memory controller 104 may also store a copy of portion 406-2 of critical chunk 404 to spare lane bit subset 306-1. In some such embodiments, this may enable both the first half 308 and the second half 310 of cache line 302 to include both portions 406-1, 406-2 of critical chunks. In various embodiments, memory controller 104 may store both portions 406-1, 406-2 to the first and second halves 308, 310 of cache line 302 in the same order. For example, primary lanes bit subsets 304-1, 304-2 may each include portion 406-1 of critical chunk 404 and spare lane bit subsets 306-1, 306-2 may each include portion 406-2 of critical chunk 404.

FIG. 7 illustrates an embodiment of a storage medium 700. Storage medium 700 may comprise any non-transitory computer-readable storage medium or machine-readable storage medium, such as an optical, magnetic or semiconductor storage medium. In various embodiments, storage medium 700 may comprise an article of manufacture. In some embodiments, storage medium 700 may store computer-executable instructions, such as computer-executable instructions to implement one or more of logic flows or operations described herein, such as with respect to logic flow 600 of FIG. 6. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable type of code, such as source code, compiled code, interpreted code, executable code, static code, dynamic code, object-oriented code, visual code, and the like. The embodiments are not limited in this context.

Figure 8:
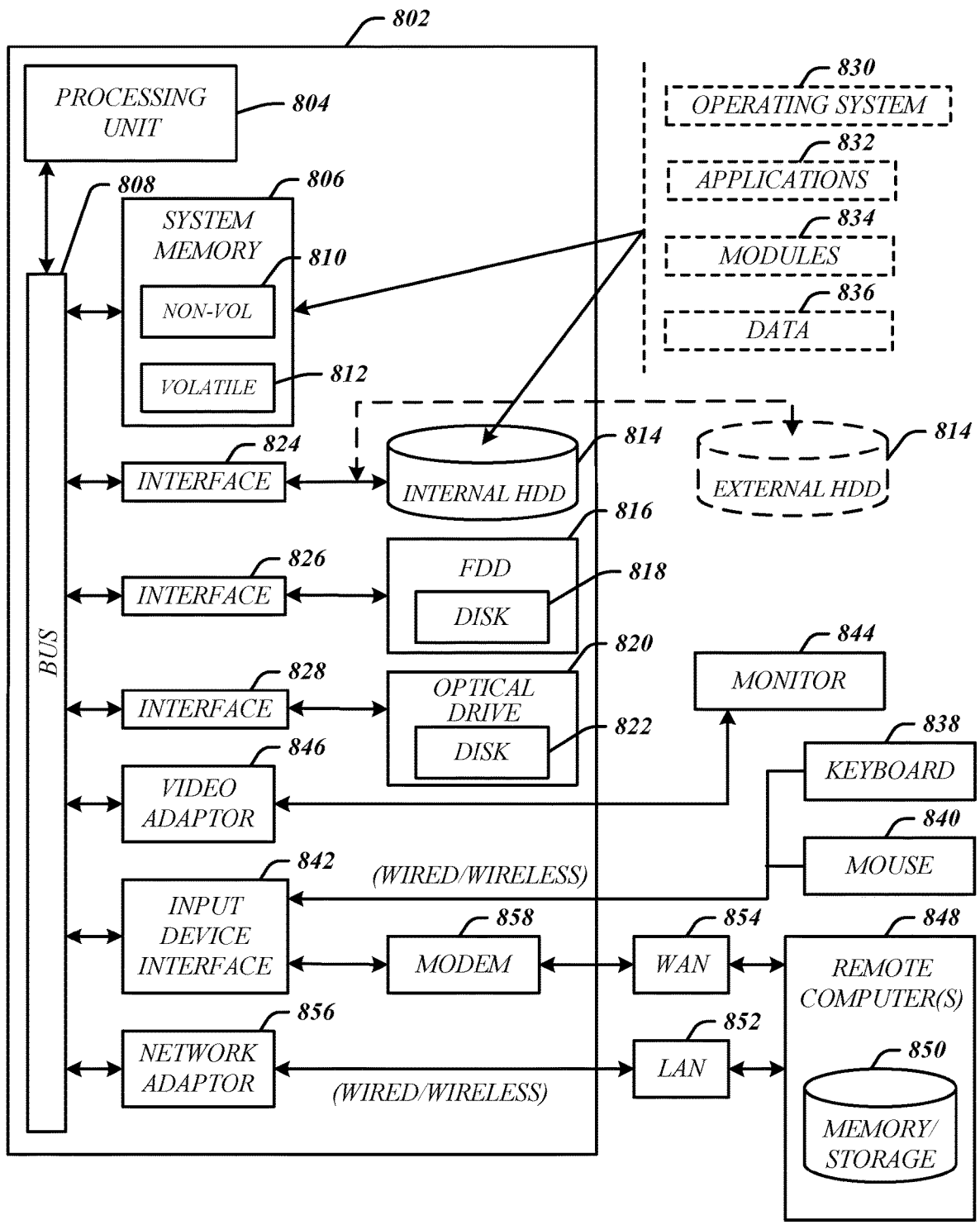
FIG. 8 illustrates an embodiment of a computing architecture.

FIG. 8 illustrates an embodiment of an exemplary computing architecture 800 that may be suitable for implementing various embodiments as previously described. In various embodiments, the computing architecture 800 may comprise or be implemented as part of an electronic device. In some embodiments, the computing architecture 800 may be representative, for example, of a computer system that implements or utilizes one or more components FIGS. 1-5C. In some embodiments, computing architecture 800 may be representative, for example, of one or more portions of system 100 that implement or utilize one or more embodiments described herein. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 800. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 800 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 800.

As shown in FIG. 8, the computing architecture 800 comprises a processing unit 804, a system memory 806 and a system bus 808. The processing unit 804 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 804. In various embodiments, processing unit 804 may comprise CPU 108.

The system bus 808 provides an interface for system components including, but not limited to, the system memory 806 to the processing unit 804. The system bus 808 can be any of several types of bus structure that may further interconnect to a memory bus (with or without a memory controller), a peripheral bus, and a local bus using any of a variety of commercially available bus architectures. Interface adapters may connect to the system bus 808 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 806 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory (e.g., one or more flash arrays), polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 8, the system memory 806 can include non-volatile memory 810 and/or volatile memory 812. In some embodiments, system memory 806 may include main memory and/or memory. A basic input/output system (BIOS) can be stored in the non-volatile memory 810.

The computer 802 may include various types of computer-readable storage media in the form of one or more lower speed memory units, including an internal (or external) hard disk drive (HDD) 814, a magnetic floppy disk drive (FDD) 816 to read from or write to a removable magnetic disk 818, and an optical disk drive 820 to read from or write to a removable optical disk 822 (e.g., a CD-ROM or DVD). The HDD 814, FDD 816 and optical disk drive 820 can be connected to the system bus 808 by a HDD interface 824, an FDD interface 826 and an optical drive interface 828, respectively. The HDD interface 824 for external drive implementations can include at least one or both of Universal Serial Bus (USB) and Institute of Electrical and Electronics Engineers (IEEE) 994 interface technologies. In various embodiments, these types of memory may not be included in main memory or system memory.

The drives and associated computer-readable media provide volatile and/or nonvolatile storage of data, data structures, computer-executable instructions, and so forth. For example, a number of program modules can be stored in the drives and memory units 810, 812, including an operating system 830, one or more application programs 832, other program modules 834, and program data 836. In one embodiment, the one or more application programs 832, other program modules 834, and program data 836 can include, for example, the various applications and/or components of system 100.

A user can enter commands and information into the computer 802 through one or more wire/wireless input devices, for example, a keyboard 838 and a pointing device, such as a mouse 840. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 804 through an input device interface 842 that is coupled to the system bus 808, but can be connected by other interfaces such as a parallel port, IEEE 994 serial port, a game port, a USB port, an IR interface, and so forth.

A monitor 844 or other type of display device is also connected to the system bus 808 via an interface, such as a video adaptor 846. The monitor 844 may be internal or external to the computer 802. In addition to the monitor 844, a computer typically includes other peripheral output devices, such as speakers, printers, and so forth.

The computer 802 may operate in a networked environment using logical connections via wire and/or wireless communications to one or more remote computers, such as a remote computer 848. In various embodiments, one or more migrations may occur via the networked environment. The remote computer 848 can be a workstation, a server computer, a router, a personal computer, portable computer, microprocessor-based entertainment appliance, a peer device or other common network node, and typically includes many or all of the elements described relative to the computer 802, although, for purposes of brevity, only a memory/storage device 850 is illustrated. In one or more embodiments, computer 802 may comprise system 100 of FIG. 1. The logical connections depicted include wire/wireless connectivity to a local area network (LAN) 852 and/or larger networks, for example, a wide area network (WAN) 854. Such LAN and WAN networking environments are commonplace in offices and companies, and facilitate enterprise-wide computer networks, such as intranets, all of which may connect to a global communications network, for example, the Internet.

When used in a LAN networking environment, the computer 802 is connected to the LAN 852 through a wire and/or wireless communication network interface or adaptor 856. The adaptor 856 can facilitate wire and/or wireless communications to the LAN 852, which may also include a wireless access point disposed thereon for communicating with the wireless functionality of the adaptor 856.

When used in a WAN networking environment, the computer 802 can include a modem 1358, or is connected to a communications server on the WAN 854, or has other means for establishing communications over the WAN 854, such as by way of the Internet. The modem 858, which can be internal or external and a wire and/or wireless device, connects to the system bus 808 via the input device interface 842. In a networked environment, program modules depicted relative to the computer 802, or portions thereof, can be stored in the remote memory/storage device 850. It will be appreciated that the network connections shown are exemplary and other means of establishing a communications link between the computers can be used.

The computer 802 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Figure 9:
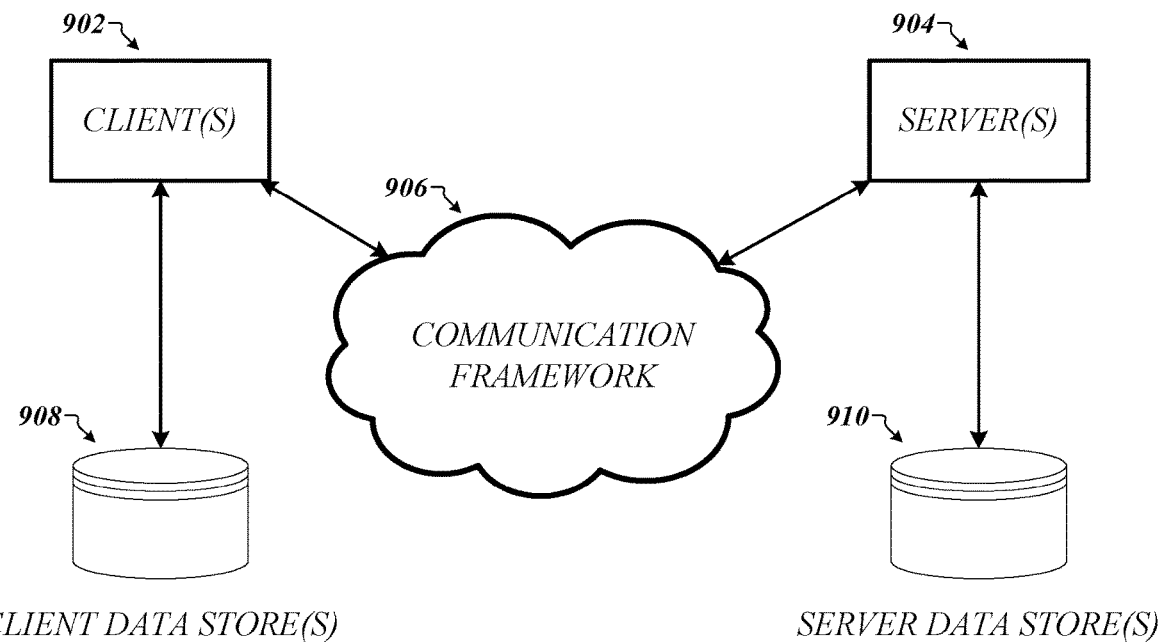
FIG. 9 illustrates an embodiment of a communications architecture.

FIG. 9 illustrates a block diagram of an exemplary communications architecture 900 suitable for implementing various embodiments as previously described, such as virtual machine migration. The communications architecture 900 includes various common communications elements, such as a transmitter, receiver, transceiver, radio, network interface, baseband processor, antenna, amplifiers, filters, power supplies, and so forth. The embodiments, however, are not limited to implementation by the communications architecture 900.

As shown in FIG. 9, the communications architecture 900 comprises includes one or more clients 902 and servers 904. The clients 902 and the servers 904 are operatively connected to one or more respective client data stores 908 and server data stores 910 that can be employed to store information local to the respective clients 902 and servers 904, such as cookies and/or associated contextual information. In various embodiments, any one of servers 904 may implement one or more of logic flows or operations described herein, and storage medium 700 of FIG. 7 in conjunction with storage of data received from any one of clients 902 on any of server data stores 910.

The clients 902 and the servers 904 may communicate information between each other using a communication framework 906. The communications framework 906 may implement any well-known communications techniques and protocols. The communications framework 906 may be implemented as a packet-switched network (e.g., public networks such as the Internet, private networks such as an enterprise intranet, and so forth), a circuit-switched network (e.g., the public switched telephone network), or a combination of a packet-switched network and a circuit-switched network (with suitable gateways and translators).

The communications framework 906 may implement various network interfaces arranged to accept, communicate, and connect to a communications network. A network interface may be regarded as a specialized form of an input output interface. Network interfaces may employ connection protocols including without limitation direct connect, Ethernet (e.g., thick, thin, twisted pair 10/100/1900 Base T, and the like), token ring, wireless network interfaces, cellular network interfaces, IEEE 802.11a-x network interfaces, IEEE 802.16 network interfaces, IEEE 802.20 network interfaces, and the like. Further, multiple network interfaces may be used to engage with various communications network types. For example, multiple network interfaces may be employed to allow for the communication over broadcast, multicast, and unicast networks. Should processing requirements dictate a greater amount speed and capacity, distributed network controller architectures may similarly be employed to pool, load balance, and otherwise increase the communicative bandwidth required by clients 902 and the servers 904. A communications network may be any one and the combination of wired and/or wireless networks including without limitation a direct interconnection, a secured custom connection, a private network (e.g., an enterprise intranet), a public network (e.g., the Internet), a Personal Area Network (PAN), a Local Area Network (LAN), a Metropolitan Area Network (MAN), an Operating Missions as Nodes on the Internet (OMNI), a Wide Area Network (WAN), a wireless network, a cellular network, and other communications networks.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following examples pertain to further embodiments, from which numerous permutations and configurations will be apparent.

Example 1 is an apparatus for memory management, the apparatus comprising: a memory; and a memory controller comprising logic, at least a portion of the logic implemented in circuitry coupled to the memory, the logic to: implement a spare lane in a memory, the memory to include a cache line comprising first and second portions of a critical chunk, the first portion included in a first half of the cache line and the second portion included in a second half of the cache line; identify a set of bits in the spare lane that correspond to the cache line, the set of bits to comprise a first subset of bits that correspond to the first half of the cache line and a second subset of bits that correspond to the second half of the cache line; and store a copy of the first portion of the cache line to the second subset of bits in the spare lane.

Example 2 includes the subject matter of Example 1, the logic to store a copy of the second portion of the cache line to the first subset of bits.

Example 3 includes the subject matter of Example 1, comprising the memory, a central processing unit (CPU), and a computer bus, the CPU communicatively coupled to the memory controller via the computer bus, the CPU to execute an operation based on the copy of the first portion of the cache line stored in the second subset of bits of the spare lane.

Example 4 includes the subject matter of Example 1, the logic to: store the copy of the first portion of the cache line to the first subset of bits; and store a copy of the second portion of the cache line to the first portion of the cache line.

Example 5 includes the subject matter of Example 4, comprising the memory, a central processing unit (CPU), and a computer bus, the CPU communicatively coupled to the memory controller via the computer bus, the CPU to execute an operation based on the copy of the first portion of the cache line stored in the first subset of bits of the spare lane.

Example 6 includes the subject matter of Example 1, the first and second portions of the cache line comprising metadata.

Example 7 includes the subject matter of Example 6, the metadata comprising a cache tag or a read identification (ID).

Example 8 includes the subject matter of Example 1, the logic to determine the spare lane is available to store the first portion of the cache line.

Example 9 includes the subject matter of Example 8, the logic to determine the spare lane is available to store the first portion of the cache line based on whether the spare lane is used by error-correcting code (ECC).

Example 10 includes the subject matter of Example 8, the logic to determine the spare lane is available to store the first portion of the cache line based on whether a hardware failure has occurred to a computer bus.

Example 11 includes the subject matter of Example 1, the memory comprising one or more of double data rate fourth-generation (DDR4) memory, a double data rate fifth-generation (DDR5) memory, and a two-level memory (2LM).

Example 12 is a computer-implemented method, comprising: implementing a spare lane in a memory, the memory including a cache line comprising first and second portions of a critical chunk, the first portion included in a first half of the cache line and the second portion included in a second half of the cache line; identifying a set of bits in the spare lane that correspond to the cache line, the set of bits comprising a first subset of bits that correspond to the first half of the cache line and a second subset of bits that correspond to the second half of the cache line; and storing a copy of the first portion of the cache line to the second subset of bits in the spare lane.

Example 13 includes the subject matter of Example 12, comprising storing a copy of the second portion of the cache line to the first subset of bits.

Example 14 includes the subject matter of Example 12, comprising executing an operation based on the copy of the first portion of the cache line stored in the second subset of bits of the spare lane.

Example 15 includes the subject matter of Example 12, comprising: storing the copy of the first portion of the cache line to the first subset of bits; and storing a copy of the second portion of the cache line to the first portion of the cache line.

Example 16 includes the subject matter of Example 15, comprising executing an operation based on the copy of the first portion of the cache line stored in the first subset of bits of the spare lane.

Example 17 includes the subject matter of Example 12, the first and second portions of the cache line comprising metadata.

Example 18 includes the subject matter of Example 17, the metadata comprising a cache tag or a read identification (ID).

Example 19 includes the subject matter of Example 12, comprising determining the spare lane is available to store the first portion of the cache line.

Example 20 includes the subject matter of Example 19, comprising determining the spare lane is available to store the first portion of the cache line based on whether the spare lane is used by error-correcting code (ECC).

Example 21 includes the subject matter of Example 19, comprising determining the spare lane is available to store the first portion of the cache line based on whether a hardware failure has occurred to a computer bus.

Example 22 includes the subject matter of Example 12, the memory comprising one or more of double data rate fourth-generation (DDR4) memory, a double data rate fifth-generation (DDR5) memory, and a two level memory (2LM).

Example 23 is at least one non-transitory computer-readable medium comprising a set of instructions that, in response to being executed by a processor circuit, cause the processor circuit to: implement a spare lane in a memory, the memory to include a cache line comprising first and second portions of a critical chunk, the first portion included in a first half of the cache line and the second portion included in a second half of the cache line; identify a set of bits in the spare lane that correspond to the cache line, the set of bits to comprise a first subset of bits that correspond to the first half of the cache line and a second subset of bits that correspond to the second half of the cache line; and store a copy of the first portion of the cache line to the second subset of bits in the spare lane.

Example 24 includes the subject matter of Example 23, comprising instructions that, in response to being executed by the processor circuit, cause the processor circuit to store a copy of the second portion of the cache line to the first subset of bits.

Example 25 includes the subject matter of Example 23, comprising instructions that, in response to being executed by the processor circuit, cause the processor circuit to execute an operation based on the copy of the first portion of the cache line stored in the second subset of bits of the spare lane.

Example 26 includes the subject matter of Example 23, comprising instructions that, in response to being executed by the processor circuit, cause the processor circuit to: store the copy of the first portion of the cache line to the first subset of bits; and store a copy of the second portion of the cache line to the first portion of the cache line.

Example 27 includes the subject matter of Example 26, comprising instructions that, in response to being executed by the processor circuit, cause the processor circuit to execute an operation based on the copy of the first portion of the cache line stored in the first subset of bits of the spare lane.

Example 28 includes the subject matter of Example 23, the first and second portions of the cache line comprising metadata.

Example 29 includes the subject matter of Example 28, the metadata comprising a cache tag or a read identification (ID).

Example 30 includes the subject matter of Example 23, comprising instructions that, in response to being executed by the processor circuit, cause the processor circuit to determine the spare lane is available to store the first portion of the cache line.

Example 31 includes the subject matter of Example 30, comprising instructions that, in response to being executed by the processor circuit, cause the processor circuit to determine the spare lane is available to store the first portion of the cache line based on whether the spare lane is used by error-correcting code (ECC).

Example 32 includes the subject matter of Example 30, comprising instructions that, in response to being executed by the processor circuit, cause the processor circuit to determine the spare lane is available to store the first portion of the cache line based on whether a hardware failure has occurred to a computer bus.

Example 33 includes the subject matter of Example 23, the memory comprising one or more of double data rate fourth-generation (DDR4) memory, a double data rate fifth-generation (DDR5) memory, and a two level memory (2LM).

Example 34 is an apparatus for memory management, the apparatus comprising: means for implementing a spare lane in a memory, the memory including a cache line comprising first and second portions, the first portion included in a first half of the cache line and the second portion included in a second half of the cache line; means for identifying a set of bits in the spare lane that correspond to the cache line, the set of bits to comprise a first subset of bits that correspond to the first half of the cache line and a second subset of bits that correspond to the second half of the cache line; and means for storing a copy of the first portion of the cache line to the second subset of bits in the spare lane.

Example 35 includes the subject matter of Example 34, comprising means for storing a copy of the second portion of the cache line to the first subset of bits.

Example 36 includes the subject matter of Example 34, comprising means for executing an operation based on the copy of the first portion of the cache line stored in the second subset of bits of the spare lane.

Example 37 includes the subject matter of Example 34, comprising: means for storing the copy of the first portion of the cache line to the first subset of bits; and means for storing a copy of the second portion of the cache line to the first portion of the cache line.

Example 38 includes the subject matter of Example 37, comprising means for executing an operation based on the copy of the first portion of the cache line stored in the first subset of bits of the spare lane.

Example 39 includes the subject matter of Example 34, the first and second portions of the cache line comprising metadata.

Example 40 includes the subject matter of Example 39, the metadata comprising a cache tag or a read identification (ID).

Example 41 includes the subject matter of Example 34, comprising means for determining the spare lane is available to store the first portion of the cache line.

Example 42 includes the subject matter of Example 41, comprising means for determining the spare lane is available to store the first portion of the cache line based on whether the spare lane is used by error-correcting code (ECC).

Example 43 includes the subject matter of Example 41, comprising means for determining the spare lane is available to store the first portion of the cache line based on whether a hardware failure has occurred to a computer bus.

Example 44 includes the subject matter of Example 34, the memory comprising double data rate fourth-generation (DDR4) memory or double data rate fifth-generation (DDR5) memory.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

The invention claimed is:

1. An apparatus for memory management, the apparatus comprising:
a memory controller comprising logic, at least a portion of the logic implemented in circuitry coupled to memory, the logic to:
implement a spare lane in the memory, the memory to include a cache line comprising first and second portions of a critical chunk, the first portion included in a first half of the cache line and the second portion included in a second half of the cache line;
identify a set of bits in the spare lane that correspond to the cache line, the set of bits to comprise a first subset of bits that correspond to the first half of the cache line and a second subset of bits that correspond to the second half of the cache line; and
store a copy of the first portion of the cache line to the second subset of bits in the spare lane.

2. The apparatus of claim 1, the logic to store a copy of the second portion of the cache line to the first subset of bits.

3. The apparatus of claim 1, comprising the memory, a central processing unit (CPU), and a computer bus, the CPU communicatively coupled to the memory controller via the computer bus, the CPU to execute an operation based on the copy of the first portion of the cache line stored in the second subset of bits of the spare lane.

4. The apparatus of claim 1, the logic to:
store the copy of the first portion of the cache line to the first subset of bits; and
store a copy of the second portion of the cache line to the first portion of the cache line.

5. The apparatus of claim 4, comprising the memory, a central processing unit (CPU), and a computer bus, the CPU communicatively coupled to the memory controller via the computer bus, the CPU to execute an operation based on the copy of the first portion of the cache line stored in the first subset of bits of the spare lane.

6. The apparatus of claim 1, the first and second portions of the cache line comprising metadata.

7. The apparatus of claim 6, the metadata comprising a cache tag or a read identification (ID).

8. The apparatus of claim 1, the logic to determine the spare lane is available to store the first portion of the cache line.

9. The apparatus of claim 8, the logic to determine the spare lane is available to store the first portion of the cache line based on whether the spare lane is used by error-correcting code (ECC).

10. The apparatus of claim 8, the logic to determine the spare lane is available to store the first portion of the cache line based on whether a hardware failure has occurred to a computer bus.

11. The apparatus of claim 1, the memory comprising one or more of double data rate fourth-generation (DDR4) memory, a double data rate fifth-generation (DDR5) memory, and a two-level memory (2LM).

12. A computer-implemented method, comprising:
implementing a spare lane in a memory, the memory including a cache line comprising first and second portions of a critical chunk, the first portion included in a first half of the cache line and the second portion included in a second half of the cache line;
identifying a set of bits in the spare lane that correspond to the cache line, the set of bits comprising a first subset of bits that correspond to the first half of the cache line and a second subset of bits that correspond to the second half of the cache line; and
storing a copy of the first portion of the cache line to the second subset of bits in the spare lane.

13. The computer-implemented method of claim 12, comprising storing a copy of the second portion of the cache line to the first subset of bits.

14. The computer-implemented method of claim 12, comprising executing an operation based on the copy of the first portion of the cache line stored in the second subset of bits of the spare lane.

15. The computer-implemented method of claim 12, comprising:
storing the copy of the first portion of the cache line to the first subset of bits; and
storing a copy of the second portion of the cache line to the first portion of the cache line.

16. The computer-implemented method of claim 15, comprising executing an operation based on the copy of the first portion of the cache line stored in the first subset of bits of the spare lane.

17. The computer-implemented method of claim 12, the first and second portions of the cache line comprising metadata.

18. The computer-implemented method of claim 17, the metadata comprising a cache tag or a read identification (ID).

19. The computer-implemented method of claim 12, comprising determining the spare lane is available to store the first portion of the cache line.

20. The computer-implemented method of claim 19, comprising determining the spare lane is available to store the first portion of the cache line based on whether the spare lane is used by error-correcting code (ECC).

21. The computer-implemented method of claim 19, comprising determining the spare lane is available to store the first portion of the cache line based on whether a hardware failure has occurred to a computer bus.

22. The computer-implemented method of claim 12, the memory comprising one or more of double data rate fourth-generation (DDR4) memory, a double data rate fifth-generation (DDR5) memory, and a two level memory (2LM).

23. At least one non-transitory computer-readable medium comprising a set of instructions that, in response to being executed by a processor circuit, cause the processor circuit to:
implement a spare lane in a memory, the memory to include a cache line comprising first and second portions of a critical chunk, the first portion included in a first half of the cache line and the second portion included in a second half of the cache line;
identify a set of bits in the spare lane that correspond to the cache line, the set of bits to comprise a first subset of bits that correspond to the first half of the cache line and a second subset of bits that correspond to the second half of the cache line; and
store a copy of the first portion of the cache line to the second subset of bits in the spare lane.

24. The at least one non-transitory computer-readable medium of claim 23, comprising instructions that, in response to being executed by the processor circuit, cause the processor circuit to store a copy of the second portion of the cache line to the first subset of bits.

25. The at least one non-transitory computer-readable medium of claim 23, comprising instructions that, in response to being executed by the processor circuit, cause the processor circuit to execute an operation based on the copy of the first portion of the cache line stored in the second subset of bits of the spare lane.

* * * * *